INVENTORS
DESMOND J. FITZGERALD
ANDREW S. GROVE
EDWARD H. SNOW

BY Gordon H Telfer
ATTORNEY

INVENTORS
DESMOND J. FITZGERALD
ANDREW S. GROVE
EDWARD H. SNOW

BY Gordon H Telfer
ATTORNEY

United States Patent Office 3,513,035
Patented May 19, 1970

3,513,035
SEMICONDUCTOR DEVICE PROCESS FOR REDUCING SURFACE RECOMBINATION VELOCITY

Desmond J. Fitzgerald and Andrew S. Grove, Palo Alto, and Edward H. Snow, Mountain View, Calif., assignors to Fairchild Camera and Instrument Corporation, Syosset, N.Y., a corporation of Delaware Filed Nov. 1, 1967, Ser. No. 679,761
Int. Cl. H01l 7/54
U.S. Cl. 148—1.5 11 Claims

ABSTRACT OF THE DISCLOSURE

A semiconductor device process for reducing surface recombination velocity, particularly in bipolar transistors, in order to provide increased current gain at low collector current. The process comprises irradiating the oxidized silicon surface of the device with ionizing radiation in order to increase the surface recombination velocity therein from an initial value to a high value, and then annealing the surface in order to reduce said velocity down to a low final value that is less than the initial value.

BACKGROUND OF THE INVENTION

Field of the invention

This invention relates to an improved process for fabricating semiconductor devices. More specifically, the invention relates to a method for controlling the surface characteristics of bipolar transistors in order to reduce the surface recombination velocity and thereby increase the current gain at low values of collector current.

Description of the Prior Art

There is an increasing demand for bipolar transistors that can operate at low current levels, such as around 10 microamperes and still have high gain. One reason for this demand is that, in general, the noise level in a transistor is proportional to the amplitude of the collector current and inversely proportional to the current gain. Another reason is that operation at low values of collector current reduces power dissipation.

The current gain, $h_{FE}$, in a transistor is defined as the collector current, $I_C$, divided by the base current $I_B$. It has been observed that the base current of a transistor tends to change with changes in the surface potential over the emitter-base junction. This relationship is shown in FIG. 1, where the change in base current is plotted as a function of the surface potential, while the collector current is at a constant value. For NPN transistors, there is a peak in this characteristic when the surface potential is positive. (For PNP transistors, the peak in base current occurs when the surface potential is negative.) FIG. 2 shows the corresponding current gain characteristic.

The peak in base current indicated in FIG. 1 is the result of electron hole recombination at fast surface states, which are located at the surface of the base region of the device. For a detailed discussion of this phenonmen, reference should be made to "Influence of Surface Conditions on Silicon Planar Tranistor Current Gain" by V. G. K. Reddi, Solid State Electronic, vol. 10, 1967, pp. 305–334.

The base current may be reduced by reducing the surface recombination velocity. The surface recombination velocity is directly proportional to the density of the fast surface states, which in turn, is a function of the character of the oxide layer and the kind of interaction taking place at the interface between the silicon substrate and the oxide layer of the transistor. A reduction in surface recombination velocity, then, can result in a substantial increase in $h_{FE}$ at low collector currents. Moreover, if the transistor is contaminated, the change in current gain at low values of collector current over a given time period is also substantially reduced. Therefore, by a special treatment of the properties of the oxide layer and of the oxide-silicon interface, one can substantially reduce the surface recombination velocity, resulting in a device having high current gain at low values of collector current suitable say for low noise circuits.

SUMMARY OF THE INVENTION

Semiconductor devices, such as silicon planar transistors, are normally subjected to various types of heat treatment during their fabrication, such as when the overlying metal contacts are alloyed to the exposed substrate. However, heat treatment alone does not substantially affect the surface recombination velocity. It was unexpectedly discovered that an improved semiconductor device could be obtained by first irradiating the surface with ionizing radiation to cause the surface recombination velocity to increase to a high value, say two orders of magnitude above its initial value. Then, when the device is subsequently annealed, the surface recombination velocity is caused to decrease to a value substantially lower than its initial value. Briefly, the invented method of controlling surface recombination velocity in a semiconductor device comprises irradiating the surface thereof with ionizing radiation of sufficient energy to increase the surface recombination velocity therein from an initial value to a relatively high value, but less than the energy necessary to cause damage in the bulk material of said device and substantial reduction of carrier lifetime. Next, the surface is annealed at a sufficient temperature and for a sufficient time period to reduce the surface recombination velocity from its high level to a low final value, whereby the final value is less than the initial value.

The method is easily adapted to conventional semiconductor fabrication processes. Both the irradiating and annealing steps may be performed when desired, and the annealing step does not have to follow immediately after the irradiating step, but may occur at a later time. Semiconductor devices made with the invented method have improved electrical characteristics when operating with the collector current at a low level. With the surface recombination velocity substantially reduced, the current gain (beta) becomes more linear. Further, higher values of beta can be achieved. In addition, the invented method may be combined with some recently discovered techniques, such as prealloying following aluminum metallization and using wafers having a (100) surface orientation, to produce devices having betas substantially higher than heretofore possible.

DESCRIPTION OF THE PREFERRED EMBODIMENT

Figure 3:
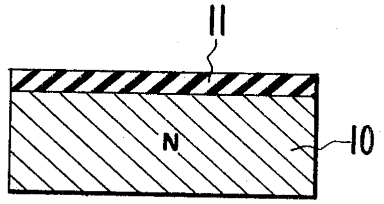
FIGS. 3–9 show the steps of a typical semiconductor fabrication process into which the invented method may be incorporated.
Figure 4:
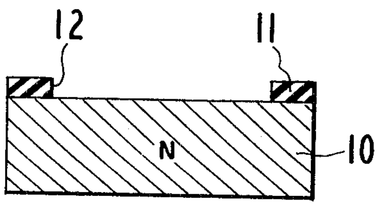
Figure 5:
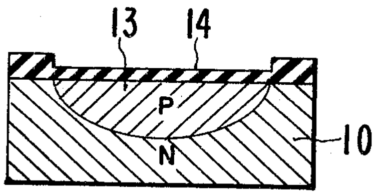
Figure 6:
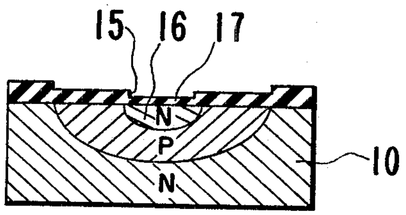

The process described in the following paragraphs is typical of conventional planar semiconductor processes, except for the steps in which the invented method is incorporated. Referring to FIG. 3, a wafer of silicon 10 is oxidized in a conventional manner to form a layer 11 of silicon oxide, normally silicon dioxide, on the surface. This layer 11 is formed on all sides of the wafer 10, but is only shown here on the top surface. The layer on the bottom surface is usually removed. Next, referring to FIG. 4, a window 12 is cut in the oxide layer 11 by conventional photolithographic techniques. The wafer of semiconductor material 10 is shown as N type material adapted for fabricating an NPN transistor. (However, a P type material can be used just as easily with appropriate changes where needed, the final device being a PNP transistor.) P type impurities are diffused through window 12 to form P type region 13, as illustrated in FIG. 5. Because this diffusion of certain P type impurities (boron, for example) is generally carried out in an oxidizing atmosphere, a thinner oxide layer 14 is formed by the oxidation during diffusion of the surface of the newly diffused P type region 13. This thinner oxide layer 14 serves as a mask for subsequent diffusions or for the attachment of contacts. Another opening 15 is then formed in oxide layer 11, and certain N type impurities (such as phosphorous, antimony, or arsenic) are diffused through this opening to form an N type emitter region 16. Again, during this diffusion, the thin oxide layer 17 is formed in the oxidizing diffusion atmosphere as shown in FIG. 6.

Figure 7:
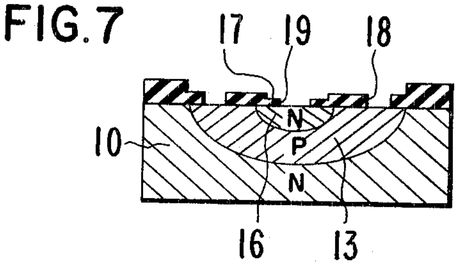
Figure 8:
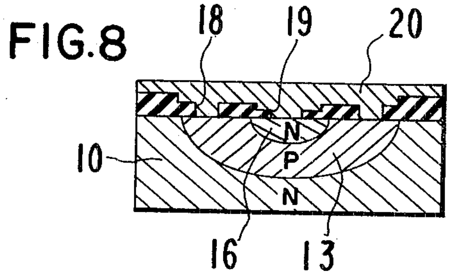

Next, as indicated in FIG. 7, an opening 18 is cut through the thin oxide layer to expose a surface of base region 13. In the embodiment shown, this opening 18 is circular. Similarly, an opening 19 is cut through the oxide layer 17 to expose a surface of the emitter region 16. Now, as illustrated in FIG. 8, a layer 20 of metal, for example, aluminum, is deposited on the entire surface of the wafer. This single metal layer 20 makes electrical contact to base region 13 through opening 18 and to emitter region 16 through opening 19. After the metal layer 20 has been deposited over the surface of the wafer 10 (shown in FIG. 8), the irradiating step of the invented method may be performed, although it may occur before or after a number of other steps during the manufacturing process. For example, the irradiating step may occur after the two PN junctions of the transistor have been formed and an oxide layer has been placed over the surface as shown in FIG. 6; or, after openings are cut through the oxide as shown in FIG. 7; or, after the metal layer 20 has been alloyed to the underlying silicon surface as shown in FIG. 8. Whenever the irradiating step is performed, however, preferably it occurs before the metal layer 20 is alloyed to the underlying silicon surface. Then, when the device is heat treated to alloy the metal layer 20, the annealing step of the invented method is performed simultaneously, thus eliminating the need for an independent annealing step. It should be noted, however, that both the irridating and annealing steps may be performed after fabrication of the device is complete, without affecting the improved operating characteristics.

As mentioned previously, the irradiating and annealing steps of the invented method do not have to be performed in sequence but may occur at convenient points during a semiconductor manufacturing process. The oxidized silicon surface of the device is irradiated with ionizing radiation of sufficient energy to cause the surface recombination velocity therein to increase from an initial value to a relatively high value (approximately two orders of magnitude higher than the initial value), but less than the energy necessary to cause damage in the bulk material of the device and consequent substantial reduction of carrier lifetime (because reduced carrier lifetime causes a corresponding reduction in gain). Suitably, the radiation dose absorbed in the oxide of the silicon surface of the device is at least about $10^7$ rads. Any of the well-known low-energy irradiation techniques may be used, such as electron, X-ray, ultraviolet, or gamma. If electron irradiation is chosen, the energy level should be less than about 100 kiloelectron volts.

Figure 9:
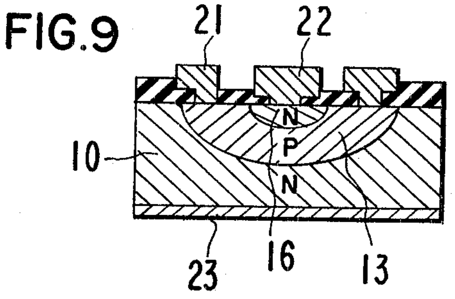

Next, the overlying metal layer 20 is etched away before the alloying step takes place, using conventional photolithographic techniques. As shown in FIG. 9, the metal layer 20 is etched to leave two separate contacts 21 and 22 to the respective base region 13 and emitter region 16.

Figure 1:
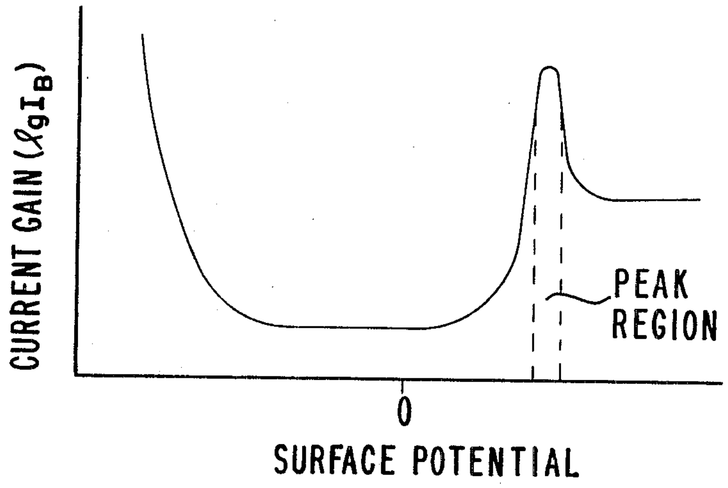
FIG. 1 is a simplified graph of base current as a function of surface potential at the base-emitter junction of an NPN transistor, with the collector current at a constant, and low value.
Figure 2:
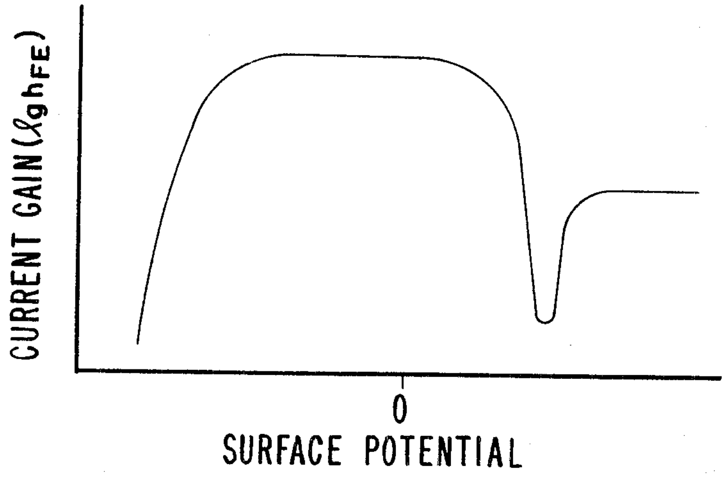
FIG. 2 is a simplified graph of current gain as a function of surface potential on the NPN transistor of FIG 1, with the collector current at a constant, and low value.
Figure 10:
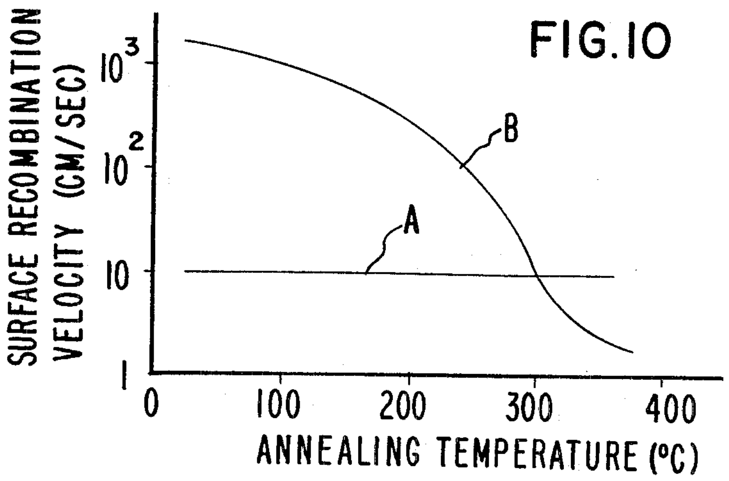
FIG. 10 is a graph of the surface recombination velocity as a function of annealing temperature for irradiated and unirradiated transistor devices.

Finally, the device is heat treated, normally in a furnace, in an inert atmosphere to alloy the metal layer 20 to the underlying silicon surface exposed in openings 18 and 19. This heat treatment step is carried out for a short period of time, and if aluminum is used, preferably at a temperature slightly below the aluminum-silicon eutectic temperature of 577° C. For example, a ten-minute heat treatment in the range of 550–570° C. is commonly employed. The times and temperatures used are related in the normal inverse manner, and it has been found that temperatures slightly above the silicon-aluminum eutectic temperature, but well below the melting point of aluminum, such as 580–590° C. may also be employed. This heat-treatment step assures that an ohmic-type contact is made between the metal layer 20 and the underlying silicon. The final heat-treatment step is also sufficient to incorporate the annealing step of the invented method, whereby the surface recombination velocity is reduced from the relatively high value to which it had been raised during the irradiating step down to a low final value that is substantially less than the initial value. As desired, the annealing step may take place at any time before the final heat-treatment step and should be above 300° C. for at least two minutes. For example, the oxidized silicon surface may be heated at 350° C. for five minutes, which is sufficient to reduce the surface recombination velocity from two to ten times below its initial value. No matter when the annealing step is performed, it is critical that the irradiating step occur first. The importance of this sequence may be seen from the graph of FIG. 10. An unirradiated semiconductor device having a surface recombination velocity of ten centimeters per second was annealed over a temperature range of 50° C. to 400° C. As indicated by curve A in FIG. 10, the surface recombinaiton velocity remained at a constant level. On the other hand, a similar semiconductor device was irradiated first by exposure to ionizing radiation of 15 kiloelectron volts electrons sufficient for the dosage to reach $10^9$ rads and for the surface recombination velocity to be raised from 10 centimeters per second to a level above $10^3$ centimeters per second. Subsequently, an annealing step was performed. When the annealing temperature was raised from 50° C. to 300° C., the surface recombination velocity was reduced down to its initial value of 10 centimeters per second, as indicated by curve B. When the annealing temperature was increased above 300° C., say to 350° C., the surface recombination velocity was reduced approximately an order of magnitude below its initial value. Thus, it should be observed that heat treatment alone does not cause the effect described. The combination of irradiation plus annealing is required, an unusual combination that gives an unexpected result. Further, it has been found that it is relatively easy to irradiate and anneal the finished wafer prior to dicing and assembling.

The invented process also works well in combination with several other recently discovered techniques for reducing surface recombination velocity. In conventional planar semiconductor processes, wafers having a (111) surface orientation are usually grown. However, it has been found that if the wafer is specially grown and cut so that it has a (100) surface orientation, the surface recombination velocity is reduced by a factor of three over that of wafers having a (111) orientation. Moreover, a special pre-alloying technique may be employed to reduce the surface recombination by an additional factor of 5, as described in U.S. patent application Ser. No. 601,776, by R. Dyck and B. Kennedy, filed Dec. 14, 1966 and assigned to the same assignee as this invention. Briefly, with the pre-alloying technique, the aluminum formed over the oxide layer is alloyed to the exposed silicon surface before, rather than after, the etching step is performed. For example, if the invented process is used in combination with a wafer having a (100) surface orientation and the prealloying technique is employed, the surface recombination velocity can be reduced by a factor of 20 to 100 below its initial level. Hence, the potential current gain at low collector current can be increased by a factor of 20 to 100 above its initial value. If the suggested combination were applied to a typical semiconductor device, having a low collector current gain between 20 and 100, the potential gain could be increased to a level between 400 and 10,000. With such high gains possible using the combination of techniques described above, it is possible to fabricate semiconductor devices which can operate satisfactorily in the nanoampere range and, eventually, in the picoampere range. At the present time, the microampere range appears to be a practical limit. Thus, the newly discovered technique provides a possible reduction in noise and power dissipation to levels heretofore thought impossible.

What is claimed is:

1. A method of controlling the surface recombination velocity in a semiconductor device comprising:

irradiating the surface of said device with ionizing radiation, of sufficient energy to cause the surface recombination velocity therein to increase from an initial value to a relatively high value;

annealing said surface at a sufficient temperature and for a sufficient time period to reduce said surface recombination velocity from said high level to a low final value, said final value being less than said initial value.

2. The method recited in claim 1 wherein said device is of silicon having an oxidized surface and the radiation dose absorbed in the oxide on the silicon surface of said device during said irradiating step is at least about $10^7$ rads.

3. The method recited in claim 2 wherein said irradiating step comprises applying ionizing radiation of less than 100 kiloelectron volt electrons.

4. The method recited in claim 2 wherein said irradiating step comprises applying ionizing radiation consisting of X-rays.

5. The method recited in claim 2 wherein during said irradiating step said surface recombination velocity is increased to a maximum value.

6. The method recited in claim 3 wherein annealing step comprises heating said oxidized silicon surface above 200° C. for at least two minutes.

7. The application of the method recited in claim 1 to a process of transistor manufacture, wherein the current gain at low collector current of a transistor device is increased by a factor of from two to ten.

8. The application recited in claim 7 wherein said collector current is less than ten microamperes.

9. In a process of semiconductor device manufacture wherein an oxide film is formed on the surface of said device; successive rectifying junctions are formed by removing portions of said film, diffusing dopants into said substrate from said surface, and reoxidizing said surface; and metal contacts are formed upon portions of said oxide film to interconnect the active regions of said device, the improvement comprising:

irradiating said oxidized surface with ionizing radiation of sufficient energy to cause the surface recombination velocity located therein to increase from an initial value to a substantially high value; and annealing said oxidized silicon surface at a sufficient temperature and for a sufficient time period to reduce said surface recombination velocity from said high level to a low final value, said final value being less than said initial value.

10. The process recited in claim 9 wherein said irradiating step is performed prior to, and said annealing step is performed simultaneously with, the step of forming said metal contacts.

11. The process recited in claim 9 wherein said irradiating energy is less than that necessary to cause damage in the bulk material of said device resulting in substantial reduction of carrier lifetime therein.

References Cited

UNITED STATES PATENTS 3,174,882 3/1965 Logan ............. 148—1.5

L. DEWAYNE RUTLEDGE, Primary Examiner

R. A. LESTER, Assistant Examiner

U.S. Cl. X.R.

148—186